United States Patent
Huang et al.

(10) Patent No.: US 7,230,863 B2
(45) Date of Patent: Jun. 12, 2007

(54) HIGH ACCESS SPEED FLASH CONTROLLER

(75) Inventors: Chen-Chi Huang, Yuan Kang (TW); Tsan-Lin Chen, Hsinchu Hsien (TW); Shang-Pin Huang, Hsinchu Hsien (TW); Chih-Yuan Wu, Hsinchu (TW)

(73) Assignee: Integrated Circuit Solution Inc., Shin-Chu (TW)

( * ) Notice: Subject to any disclaimer, the term of this patent is extended or adjusted under 35 U.S.C. 154(b) by 97 days.

(21) Appl. No.: 11/217,503

(22) Filed: Sep. 2, 2005

(65) Prior Publication Data

US 2007/0070729 A1    Mar. 29, 2007

(51) Int. Cl.
G11C 7/00 (2006.01)

(52) U.S. Cl. .................. 365/194; 365/185.19

(58) Field of Classification Search ............... 365/194, 365/185.19, 189.03, 189.04
See application file for complete search history.

(56) References Cited

U.S. PATENT DOCUMENTS

| | | | |
|---|---|---|---|
| 6,172,919 B1 * | 1/2001 | Horikawa | 365/190 |
| 7,006,403 B2 * | 2/2006 | Joshi et al. | 365/230.06 |
| 7,099,222 B2 * | 8/2006 | Takahashi et al. | 365/222 |
| 2005/0174860 A1 * | 8/2005 | Kim et al. | 365/196 |

* cited by examiner

*Primary Examiner*—Anh Phung
(74) *Attorney, Agent, or Firm*—Troxell Law Office, PLLC

(57) ABSTRACT

A high access rate flash control provided for accessing more than one flash memory chip having different access timing specifications is disclosed. The controller comprises a read/write(R/W) pulse generator, a R/W delay chain circuit, a sampling delay chain circuit, a bi-directional feedback pad (PAD1), a data bus sampler, and a second pad (PAD 2). In an embodiment, the flash controller using a fix clock to generate synchronized Read/Write pulse which is then appropriated adjusted by the R/W delay chain circuit to provide optimum R/W control signal. The adjusted R/W signal is than outputted by a bi-directional pad to flash memory chips. With the external signal feedback function, the bi-directional pad has associated with the sampling delay chain, the time latency due to pads can be eliminated nearly. Thus, the flash controller can approach high rate to access flash chips.

17 Claims, 4 Drawing Sheets

HIGH ACCESS SPEED FLASH CONTROLLER

FIELD OF THE INVENTION

The present invention relates to a flash controller, specifically, to a flash controller used to access flash memory by high rate.

BACKGROUND OF THE INVENTION

Sync circuit is widely used in the field of integrated circuit (IC) design. Owe to sync circuit operated based on clock, it is thus readily to a circuit design engineer use EDA Tool as a auxiliary tool of circuit design so as to design and analyze the circuit.

Since the interface between flash memory and conventional, flash controller is typically asynchronies and the flash controllers may be sold to many flash memory chip (hereinafter called flash chip) supplier who may use the flash controllers to control the flash chips of which access time or parameters may different due to manufacturer are different or memory types or capacities are various, even they are produced by the same manufacturer. Consequently, a major rate bottleneck for a large capacity of flash disk package which use a flash controller to control flash chips, may often be determined by the aforementioned interface. Generally, flash chip at data bus has lower drive capability, and a flash disk is composed of a plurality of flash chips, thus the data bus loading is heavy. The rate of data access is thus restrained by the drive capability. To access data correctly from a large flash disk, a typical strategy is implemented by reducing the working frequency.

Due to the drive capability is usually a main rate bottleneck while accessing a flash disk, high access rate flash control is only using in those flash disk having small capacity, otherwise, to access high capacity, the working frequency has to be down so as to ensure access data correctly.

An object of the present invention is to overcome above problems.

SUMMARY OF THE INVENTION

An object of the present invention is to provide a flash controller for sync or async circuit accessing data from flash chips by high rate. Particularly, for the flash controller can control data access to the flash chips.

The flash controller according to the present invention can control flash chips by high access rate, even the flash chip is provides by manufacturer or supplier without sacrificing working frequency or extra relevant external circuit design, but only change a control signal stored in the firmware according to timing specification of the flash chips. The high access rate flash controller comprises a read/write(R/W) pulse generator, a R/W delay chain circuit, a sampling delay chain circuit, a bi-directional feedback pad (PAD1), a data bus sampler, and a second pad (PAD 2). In an embodiment, the flash controller using a fix clock to generate synchronized Read/Write pulse which is then appropriated adjusted by the R/W delay chain circuit to provide optimum R/W control signal. The adjusted R/W signal is than outputted by a bi-directional pad to flash chips. With the external signal feedback function, the bi-directional pad has associated with the sampling delay chain, the time latency due to pads can be eliminated nearly. Thus, the flash controller can approach high rate accessing several flash chips.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

As depicted in the forgoing background of the invention, a flash controller is used to control flash chips. However, if the flash chips is fabricated by various manufacturer or the flash memory chips being different types will affect data access rate due to their timing specification may differ thereby causing circuit design in trouble.

The present invention thus discloses a flash controller having two delay chain and an external signal feedback to improve access rate while Read/Write the flash memory. One of the delay chains is to comply with the Write timing specifications of various flash chips. The other delay chain and the external signal feedback are to comply with Read timing specifications. Therefore the flash controller can provide the flash memory being access with optimum rate.

According to a prefer embodiment of the present invention, the flash controller has registers to provide the firmware adapting to the flash chips of which Read/Write parameters specified in time specification are various and provide appropriate sampling point while flash controller accesses data from the data bus.

Figure 1:
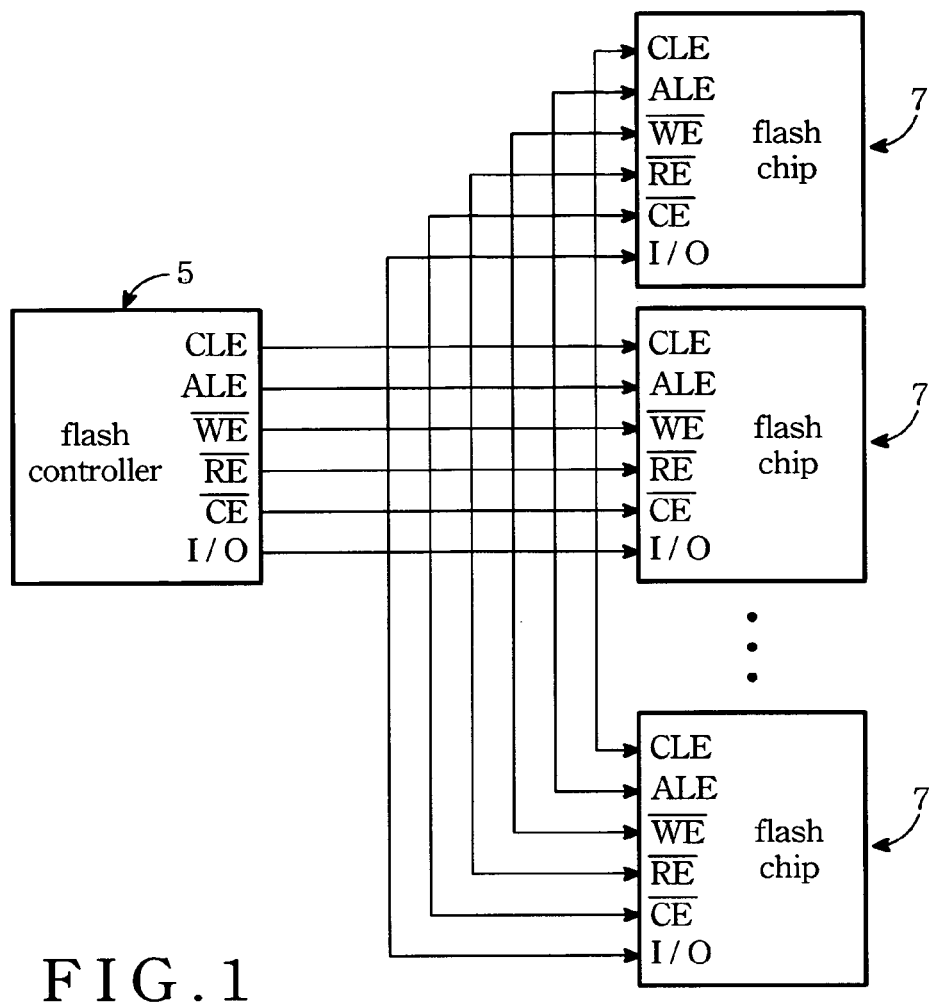
FIG. 1 illustrates the flash controller coupled with several flash chips of the same type or even different types in accordance with the present invention.

Referring to FIG. 1, a flash control can control several flash chips in high access rate no matter types of the flash chips belong to the same or not.

Figure 2:
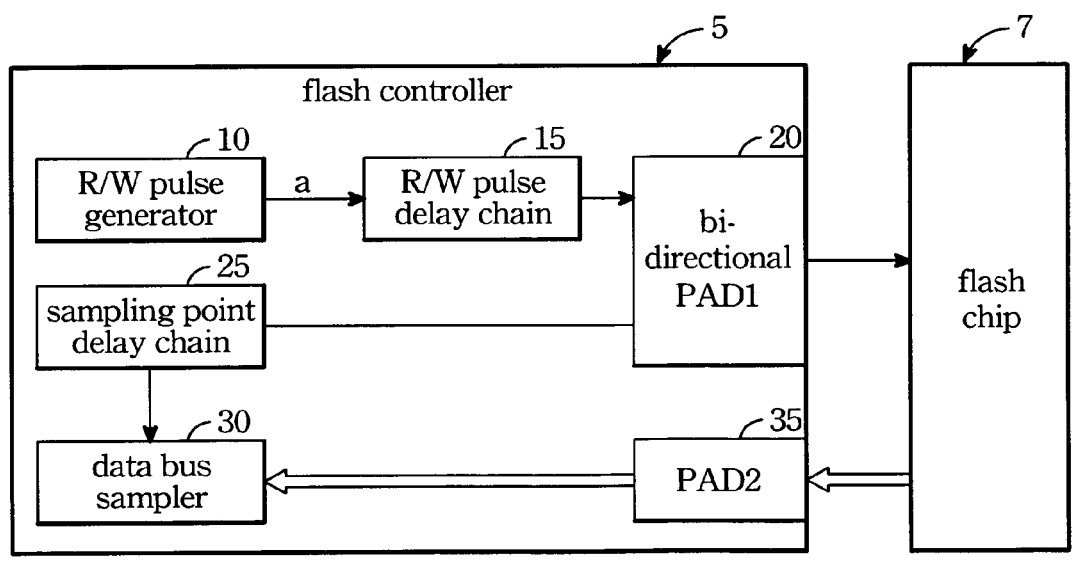
FIG. 2 illustrates functional blocks inside the flash controller in accordance with the present invention.

Preferably, referring to FIG. 2, the flash controller 5 includes a Read/Write pulse generator 10, Read/Write pulse delay chain circuit 15, bi-directional feedback input/output (I/O) pad (PAD1) 20, sampling point delay chain circuit 25, data bus sampler 30, and second I/O pad (PAD2) 35. The sampling point delay chain circuit 25 is an optional so that a signal outputting from the bi-directional feedback I/O pad 20 can be directly feedback to the data bus sampler 30.

Since, every time the flash controller 5 executes any operations about Read or Write, it has to comply with the timing specification. Consequently, in response to various types of flash chips 7 or flash chips suppliers having different timing specification thereof, which may cause incorrectly sampling (Read) or Write, the delay chain circuits 15, 25 and the bi-directional feedback I/O pad 20 feed-backed the external signal can improve those access rate problems.

The flash controller 5 generates sync Read/Write pulse according to a fixed clock timing and the timing of the Read/Write pulse is then modified by delay chain 15, 25 so that the flash chips can get optimizing Read/Write signal. The latter associated with the external signal feedback can eliminating time latency among flash chips.

Figure 3:
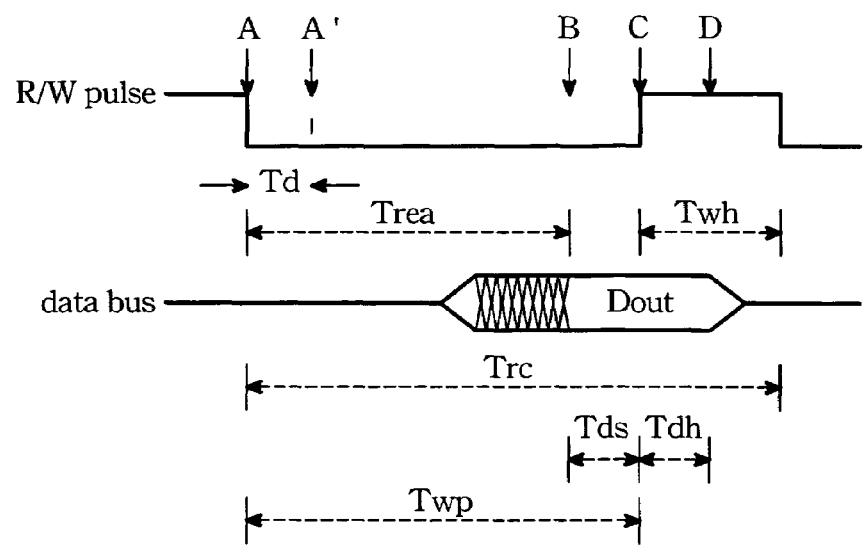
FIG. 3 shows parameters of flash chips in accordance with time specification.

Please refer to table 1, which lists timing specifications of several Read/Write pulse related parameters. FIG. 3 showing the parameters by a sketched diagram.

| Parameters of Timing Specification | Min | Max | Unit |
|---|---|---|---|
| Trea | — | 18 | ns |
| Twh | 10 | — | ns |
| Twp | 15 | — | ns |
| Trc | 30 | — | ns |
| Tdh | 5 | — | ns |
| Tds | 15 | — | ns |

In table 1, timing specification specified minimum value of a period of R/W pulse is 30 ns; maximum value of $T_{rea}$, the time interval from low state (for data reading) of R/W pulse, which data are present at data bus to an end of transit time, is about 18 ns; minimum Write enable holding time Twh, which R/W pulse is high, is about 10 ns; Tdh is minimum data holding time while in Write phase, as is shown in table 1 Tdh=5 ns. Tds is the minimum data holding time at data bus before Write phase, as is shown: Tds=15 ns. Twp is the pulse width of write enable, please see FIG. 3, Twp=15 ns (please see table 1).

With respect to Read and Write operation of the flash control to flash chips, the illustrations are as follows:

With Respect to Write Data into Flash Chips

Generally, parameters: Twh, Twp, Tdh and Tds are various in accordance with type of flash chips manufacturers. As flash controller is desired to write data into flash chips, the effective data should be ready and at the data bus writing for programming, thus the parameters: Tdh and Tds are easily to satisfy the timing specification, but Twh and Twp are not. The bottleneck is usually occurred on Twh and Twp for high rate data programming. For sync circuit, it is difficult to access data at optimum rate while a flash controller takes over flash chips of which types are various from one to another.

Figure 4:
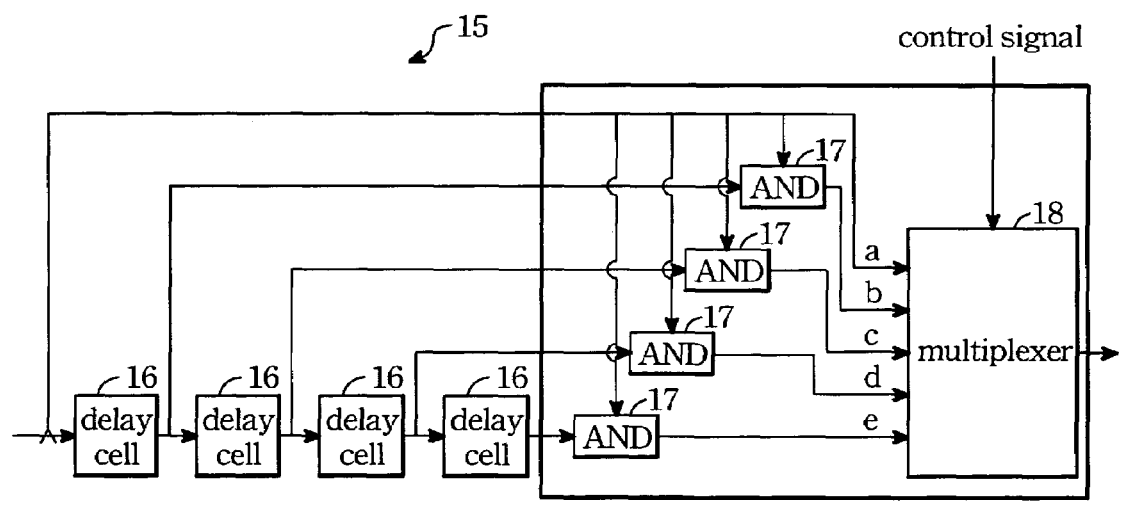
FIG. 4 shows a schematic diagram of the R/W pulse delay chain circuit in accordance with the present invention.
Figure 5:
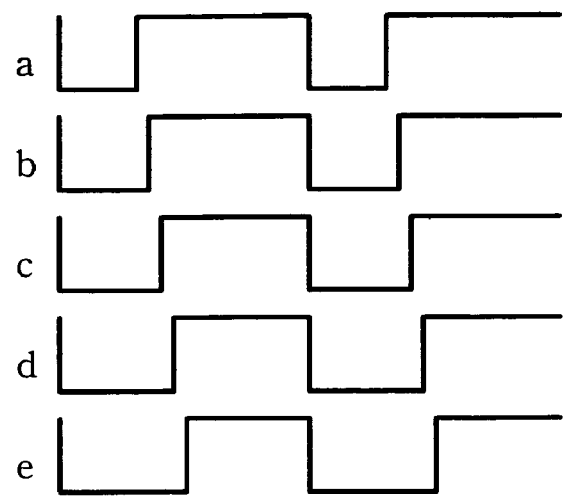
FIG. 5 shows several pulse signals responses after a R/W pulse processed by the R/W pulse delay chain circuit in accordance with the present invention.

The optimum programming rate can be approached by means of delay chains in accordance with the present invention. Referring to FIG. 4, which depicts a diagram of delay chain 15 for Write pulse phase. In FIG. 4, each delay cell 16 represents a delay circuit therein. FIG. 5 shows signal responses of several Write signals in response to various delay time requirements. In FIG. 5, the signal a is an original input signal having fixed pulse width generated by a sync circuit and the signals b, c, d, and e are responsive signals. The responsive signals b, c, d, and e are results of the signal a by logic AND operated with signals that the signal a pass through delay cells 16 in different numbers, please see FIGS. 4 to 5. The responsive signals b, c, d, and e can be selected one by a multiplexer 18 with a firmware control signal 18 in accordance with R/W wave form requirements to parameters Twh and Twp, depicted in timing specification so that the flash controller can handle various types of flash chips.

With Respect to Read Data Out from Flash Chips

When the flash controller 5 executes Read operation from the flash chips, many parameters specified has to satisfy according to timing specification so as to correctly read from the data bus of the flash chips. The bi-directional feedback I/O pad 20 associated with sampling delay chain circuits 25 can approach the objection of optimum Read action.

Figure 6:
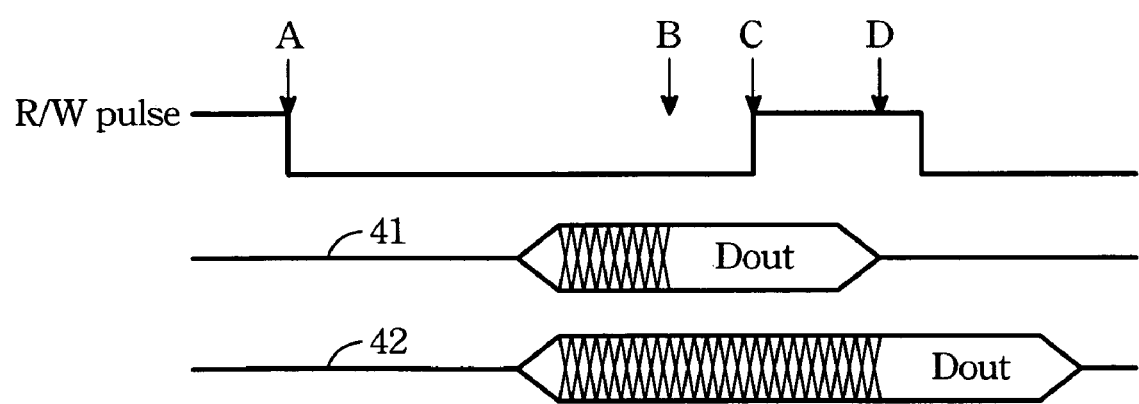
FIG. 6 shows the data bus responses of one flash chip and several flash chips as coupled with the flash controller.

FIG. 6 is a comparing diagram illustrates responses of flash array constitute by one flash chip 41 with that of more than one flash chips 42 at data bus.

For flash array constituted of single flash chip, the available time interval for Read data (data present at data bus) is from time B to time D (see FIG. 6). For ensuring data Read correctly, the sampling point for the data bus is at C. By contrast, for flash array is composed of a plurality of flash chips, the available time of data present at data bus should be post the time D because the driving ability for latter situation 42 will be weaker than the former 41. Before time D the data signals are unstable (or unreliable), transit signals. Thus if the sampling point is at time C, it may cause Read data incorrectly. To ensure correct Read, one of the conventional methods is reduce the timing clock.

Figure 7:
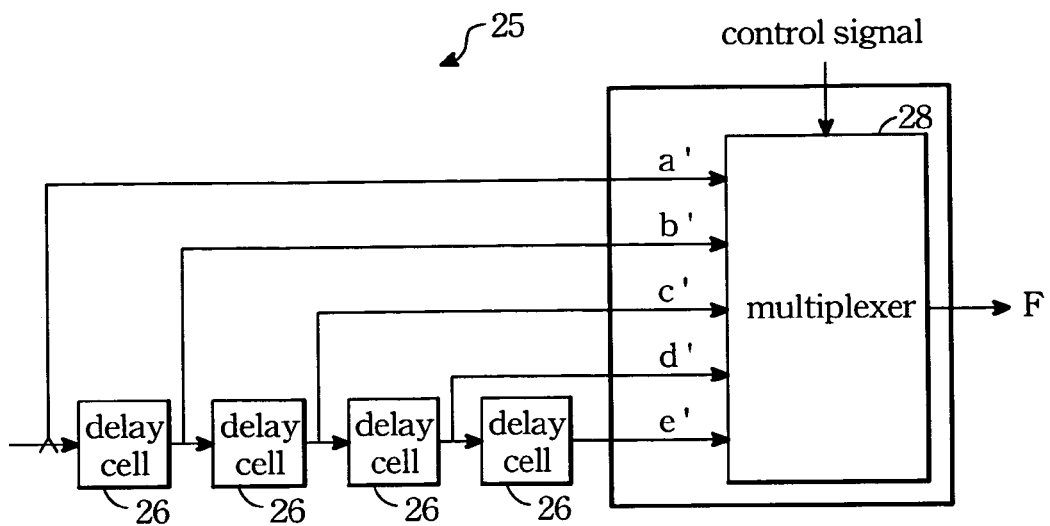
FIG. 7 shows a schematic diagram of the sampling point delay chain circuit in accordance with the present invention.
Figure 8:
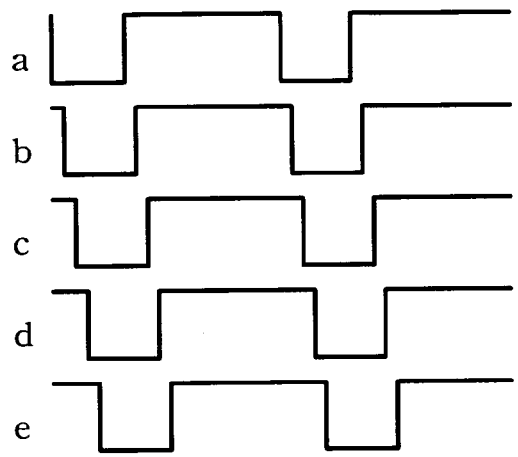
FIG. 8 shows several R/W signals are time position shift after passed through the sampling point delay chain circuit in accordance with the present invention.

According to a preferred embodiment of the present invention the flash controller, instead of descending frequency but by sampling point delay chain circuit 25 (see FIG. 7) and a bi-directional feedback I/O pad to ensure sampling correctly, thus fast access the flash chips can be approached (see FIG. 8, and return to FIG. 2).

The detailed circuit of sampling point delay chain circuit 25, please see FIG. 7. The circuit 25 has a basic architecture, such as delay cell 28, and multiplexer 28 similar to the R/W pulse delay chain circuit 15 but logic AND gates are skipped. FIG. 8 shows the signals shift their relative position but the R/W pulse width of original is not changed. That is the sampling time is changed according to the flash chip numbers, and the types of them. The appropriate sampling time, e.g. after time D, can be acquired by a firmware control signal according to types or numbers of flash chips defined by the timing specification so that the flash controller can read data accurately from flash chips.

Figure 9:
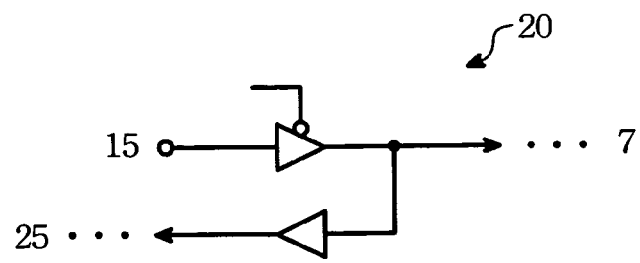
FIG. 9 shows an equivalent circuit of the bi-directional I/O pad in accordance with the present invention.

Referring to FIG. 9, an equivalent circuit of the bi-directional feedback I/O pad is shown. Generally, the pad is likely as a bridge used for signal transfer from the inner circuit of an IC (e.g. flash control) to its external (e.g. flash chips 7) For driving larger current, planar area occupied by the pad is demanded to be larger, as a result, the delay time due to pads is significant even longer than the sum of the internal circuit. For instance, when the flash controller generate two Read signals, ideally, the target data in the flash chips will be placed to the data bus after $T_{rea}$ delay time. Thereafter, the data sampler will fetch the data from the data bus at the time C. However, Read signal is not received due to pad delay until time A' (please see FIG. 3). Thus, available data will not be presented at data bus till $T_{rea}$+Td. The data is then delayed again due to PAD2 delay. Thus, the available fetched time for sampler is possibly behind the time C (see FIG. 3). Data sampling at time C will be incorrect.

Consequently, if the flash controller 5 send a signal to flash chips 7 from the inner circuit through PAD1 30 to the flash chips 7 and then in response to the Read signal, the flash chips 7 places the corresponding data to the data bus and then through PAD2 35 to the flash controller 5. Twice delays due to PAD1 and PAD2 are found. To introduced. Still referring to FIG. 9, a Read signal outputted from the output-buffer 20a of the bi-direction I/O pad (PAD1) 20 is fed back to the input-buffer 20b. Consequently, the bi-direction I/O pad (PAD1) 20 can compensate the effect of twice delays (PAD1 and PAD2d). The sampling delay chain circuit 25 is further provides the most appropriate sampling point to ensure of the data to be read correctly. The benefits of this invention are:

(1) By means of forgoing hardware, the flash controller can use to handle different types or brands flash chips without scarify the accessing rate, though, their timing specification may be different in accordance with the manufacturer.

(2) The flash controller can handle different capacity size of flash disk in an optimum accessing rate. It is not necessary to modify the relate periphery circuit for different flash chip capacity.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

What is claimed is:

1. A flash controller for flash chips control, comprising:
   a R/W pulse generator to generate a R/W pulse;
   a R/W pulse delay chain circuit receiving said R/W pulse and generating a plurality of delayed signals having different time delays, respectively, and then outputting one from them according to timing specification of said flash chips;
   a data bus sampler;
   a bi-directional, first I/O pad, receiving said delayed signal then send to said flash chips and said data bus sampler;
   a second I/O pad, for receiving a R/W control signal from said flash chips and outputting said R/W control signal to said data bus sampler thereby fetch data.

2. The flash controller according to claim 1 wherein said R/W pulse delay chain circuit comprises a plurality of delay cells, and corresponding numbers of AND gates so as to generate a plurality of R/W pulse delayed signals having different pulse width, respectively.

3. The flash controller according to claim 2 wherein said delay cells are series connected, and said R/W pulse is inputted to the first delay cell, furthermore, said R/W pulse is, respectively, logic AND operated with signals out from each node of delay cells to generate said delayed signals.

4. The flash controller according to claim 2 wherein said multiplexer is to choose one which satisfy Twp, and Twh in timing specification of said flash chips from the group consisting of said R/W pulse, R/W pulse delayed signals.

5. The flash controller according to claim 1 wherein said multiplexer is controlled by a signal provided by firmware.

6. The flash controller according to claim 1 wherein said firmware is a register controlled by a application program.

7. The flash controller according to claim 1 further comprising a sampling point delay chain circuit located in between said bi-directional I/O pad and said data bus sampler.

8. The flash controller according to claim 7 wherein said sampling point delay chain circuit is composed of a plurality of delay chains series connected, and a multiplexer, and then all delayed signals out from each node and a signal out from said bi-directional I/O pad are acted as input signals of said multiplexer so as to choose one from them as a sampling point.

9. The flash according to claim 7 wherein said bi-directional I/O pad is composed of a output buffer having a control terminal and input buffer, wherein said output buffer feed back a signal to said input buffer.

10. The flash controller according to claim 7 wherein said sampling point delay chain circuit is composed of a plurality of delay chains series connected, and a multiplexer, and then all delayed signals out from each node and a signal out from said bi-directional I/O pad are acted as input signals of said multiplexer so as to choose one from them as a sampling point.

11. The flash controller according to claim 7 wherein said bi-directional I/O pad is composed of a output buffer having a control terminal and input buffer, wherein said output buffer feed back a signal to said input buffer.

12. A flash controller for flash chips control, comprising:
    a R/W pulse generator to generate a R/W pulse;
    a R/W pulse delay chain circuit receiving said R/W pulse and generating a plurality of delayed signals having different time delays, respectively, and then outputting one from them according to timing specification of said flash chips;
    a sampling point delay chain circuit;
    a bi-directional, first I/O pad, receiving said delayed signal then send to said flash chips and said sampling point delay chain circuit;
    a data bus sampler receiving signals from said sampling point delay chain circuit;
    a second I/O pad, for receiving a R/W control signal from said flash chips and outputting said R/W control signal to said data bus sampler thereby fetch data.

13. The flash controller according to claim 12 wherein said R/W pulse delay chain circuit comprises a plurality of delay cells, and corresponding numbers of AND gates so as to generate a plurality of R/W pulse delayed signals having different pulse width, respectively.

14. The flash controller according to claim 13 wherein said delay cells are series connected, and said R/W pulse is inputted to the first delay cell, furthermore, said R/W pulse is, respectively, logic AND operated with signals out from each node of delay cells to generate said delayed signals.

15. The flash controller according to claim 13 wherein said multiplexer is to choose one which satisfy Twp, and Twh in timing specification of said flash chips from the group consisting of said R/W pulse, R/W pulse delayed signals.

16. The flash controller according to claim 12 wherein said multiplexer is controlled by a signal provided by firmware.

17. The flash controller according to claim 12 wherein said firmware is a register controlled by a application program.

* * * * *